United States Patent
Kast et al.

(10) Patent No.: US 9,194,700 B2
(45) Date of Patent: Nov. 24, 2015

(54) DEVICE AND METHOD FOR REDUCING A WEDGE ERROR

(75) Inventors: Michael Kast, Wels (AT); Christian Grünseis, Mehrnbach (AT); Alois Malzer, Münzkirchen (AT)

(73) Assignee: EV Group E. Thallner GmbH (AT)

( * ) Notice: Subject to any disclaimer, the term of this patent is extended or adjusted under 35 U.S.C. 154(b) by 101 days.

(21) Appl. No.: 13/820,166

(22) PCT Filed: Sep. 3, 2010

(86) PCT No.: PCT/EP2010/005423
§ 371 (c)(1),
(2), (4) Date: Mar. 1, 2013

(87) PCT Pub. No.: WO2012/028166
PCT Pub. Date: Mar. 8, 2012

(65) Prior Publication Data
US 2013/0162997 A1    Jun. 27, 2013

(51) Int. Cl.
| | | |
|---|---|---|
| *G01B 21/24* | (2006.01) | |
| *G01B 11/26* | (2006.01) | |
| *G01B 11/14* | (2006.01) | |
| *G03F 7/00* | (2006.01) | |
| *G01B 11/27* | (2006.01) | |

(52) U.S. Cl.
CPC .............. *G01B 21/24* (2013.01); *G01B 11/14* (2013.01); *G01B 11/26* (2013.01); *G01B 11/272* (2013.01); *G03F 7/0002* (2013.01)

(58) Field of Classification Search
None
See application file for complete search history.

(56) References Cited

U.S. PATENT DOCUMENTS

| | | | |
|---|---|---|---|
| 4,825,086 A | 4/1989 | Mueller | 250/491.1 |
| 2004/0168588 A1* | 9/2004 | Choi et al. | 101/150 |
| 2009/0101037 A1* | 4/2009 | Suehira et al. | 101/484 |
| 2009/0283938 A1* | 11/2009 | Suehira et al. | 264/447 |
| 2012/0127485 A1* | 5/2012 | Yamauchi | 356/614 |

(Continued)

FOREIGN PATENT DOCUMENTS

| | | | | |
|---|---|---|---|---|
| AT | 501001 A1 | 5/2006 | | G03F 7/20 |
| CN | 1454333 A | 11/2003 | | G03F 7/00 |
| CN | 101292195 A | 10/2008 | | G03F 7/00 |

(Continued)

OTHER PUBLICATIONS

Int'l Search Report from corresponding PCT/EP2012/005423 (Form PCT/ISA/210); 2 pages (English version only).

(Continued)

*Primary Examiner* — Gordon J Stock, Jr.
(74) *Attorney, Agent, or Firm* — Kusner & Jaffe

(57) ABSTRACT

A device for aligning a first surface of a first substrate with a second surface of a second substrate as the first and the second surfaces move toward each other across a gap. The device is comprised of:
  a first retaining system for retaining the first substrate on a first retaining surface;
  a second retaining system for retaining the second substrate on a second retaining surface;
  approach means for causing the first surface to approach the second surface in one direction of translation (T) toward an end position; and
  means for reducing a wedge error between the first and second surfaces during the approach of the first surface to the second surface including an in situ measurement during the approach of the substrates.

9 Claims, 1 Drawing Sheet

(56) References Cited

U.S. PATENT DOCUMENTS

2012/0299208 A1* 11/2012 Hansen et al. ............... 264/40.1
2013/0147070 A1* 6/2013 Kast et al. ..................... 264/1.1

FOREIGN PATENT DOCUMENTS

| CN | 101454636 A | 6/2009 | ............. G01B 11/14 |
| DE | 3623891 A1 | 1/1988 | ............... G03F 7/20 |
| DE | 10139586 A1 | 3/2003 | ............... G03F 7/20 |
| JP | 55016457 | 2/1980 | ............. H01L 21/30 |
| JP | 58103136 | 6/1983 | ............. H01L 21/30 |
| JP | 2002-229471 | 8/2002 | ................ G02F 1/13 |
| WO | WO 02/10721 A2 | 7/2002 | ............. G01N 21/00 |

OTHER PUBLICATIONS

Office Action issued in corresponding Japanese Patent Application No. 2013-526318, Mar. 17, 2014.

Office Action (dated Jan. 12, 2015) issued in connection with corresponding Chinese Patent Application No. 201080068928.3 (with English translation).

* cited by examiner

DEVICE AND METHOD FOR REDUCING A WEDGE ERROR

FIELD OF THE INVENTION

The present invention relates to a device for opposite alignment of a first surface of a first substrate with a second surface of a second substrate with a gap between the first and the second surfaces.

BACKGROUND OF THE INVENTION

In the semiconductor industry, there are a host of devices and methods in which a calibration of two surfaces to one another is of great importance. The surfaces are generally structured surfaces whose structures must be aligned to one another. In all methods that undertake these calibrations, it would be desirable for errors in alignment, especially wedge errors, such as deviations in the angular position of the two opposing surfaces that are to be aligned, to be minimized or largely precluded. Ideally, the surfaces of the substrates are to be aligned exactly parallel to one another in one end position, for example, in embossing a microlens or in producing a mask in the lithography method. In the example of microsystems engineering, and particularly, in the production of microlenses that must become smaller and at the same time more accurate as optical lenses due to the miniaturization pressure in the semiconductor industry, the aforementioned errors have an especially drastic effect.

Furthermore, it is especially important that the optical axis of the microlens does not have any alignment errors that are caused especially by wedge errors. Microlenses are often stacked on top of one another so that the wedge errors are correspondingly exacerbated, and the image quality suffers accordingly.

Furthermore, efforts are aimed at minimizing the scrap in the mass production of microlenses.

The aforementioned wedge error arises due to mis-positioning of the embossing substrates to one another or mis-positioning of the retaining systems that accommodate the embossing substrates to one another in the end position where the embossing material is cured. The positioning of the embossing substrate is decisive for the production of the components to be embossed, especially microlenses.

The wedge error has been reduced in the past by parallel alignment of the retaining system as accurately as possible before the retaining systems close the gap between the surfaces of the substrates and before the actual embossing process in which the substrates are moved toward one another in the direction of translation.

The present invention provides a device and a method wherein alignment errors in the alignment of two spaced substrates can be minimized, and as a result, the quality of the products to be produced increases and the production costs are drastically reduced.

The foregoing is achieved with the features of the claims. Further advantageous developments of the invention are indicated in the dependent claims. All combinations of at least two of the features indicated in the specification, the claims and/or FIG. 1 also fall within the framework of the invention. At the indicated value ranges, values within the above-mentioned limits will also be disclosed as boundary values (limits) and will be claimed in any combination.

SUMMARY OF THE INVENTION

The invention is based on the idea of undertaking a reduction of alignment errors, especially of a wedge error between two substrates, not before the substrates' approach into the end position, but during the approach and until reaching the end position. Introduction of a measurement system between the substrates to be aligned can accordingly be abandoned according to the invention. The gaps or the angular position of the first to the second substrate, or of the first retaining system and the second retaining system, during the approach of the substrates are measured according to the invention from outside the working space that is formed between the first and second surfaces. In-situ measurement during the approach of the substrates is enabled up to completion of the product, such as, a microlens field or a mask, that is to be produced with the device.

Inasmuch as an embossing material that is to be embossed by the first and second substrates is introduced into the intermediate space, alignment according to the invention takes place after the embossing material is moved into the intermediate space or after the embossing material is moved onto the first or second substrate that is designed as a carrier substrate. It is especially advantageous if the reduction of the wedge error takes place shortly before or upon reaching the end position, since errors due to further movements of the first and/or second substrate can thus be essentially precluded.

According to one advantageous embodiment of the invention, the means for reducing the wedge error can be used continuously, especially uninterruptedly, during the approach, especially until reaching the end position. The present invention is especially advantageous in conjunction with nanoimprint methods, inasmuch as on the first surface and/or the second surface, there are embossing structures for embossing of an embossing material between the first and second surfaces.

According to another advantageous embodiment of the invention, the means for reducing the wedge error comprise spectroscopically working measurement means for measuring the angular position between the first substrate and the second substrate during the approach of the first surface to the second surface. By measuring the angular position of the first and second surfaces relative to one another during the approach of the first surface to the second surface, or vice versa, as far as the end position, it is possible to act accordingly on the first substrate and/or the second substrate or the first retaining system and/or the second retaining system, by the means for reducing the wedge error, in order to align the first and second surfaces in parallel so that in the ideal case, there is no longer a wedge error, especially when the end position is reached.

It is especially advantageous if the measurement means have several, preferably at least three, sensors installed in the first and/or second retaining system underneath each the first and/or second retaining surface for measuring the gaps of the first surface and of the second surface relative to the respective sensor in the direction of translation, and primarily the gaps of a first support surface of the first substrate facing away from the first surface and a second support surface of the second substrate facing away from the second surface. By integrating the sensors, space-saving and reliable detection of the angular position of the retaining surfaces or the surfaces in situ is possible.

Advantageously, in one embodiment of the invention, it is furthermore provided that the means for reducing the wedge error comprises driving means for changing the angular position of the first substrate to the second substrate, especially of the first surface relative to the second surface. The driving means is located on the first and/or second retaining system. The driving means are preferably motors for each retaining system that for at least one of the retaining systems make available at least two, preferably three, degrees of rotational freedom, whose axes of rotation are perpendicular to one another and that can tilt the retaining system arbitrarily to the direction of translation.

According to another advantageous embodiment of the invention, the means for reducing the wedge error have an active control means for controlling the reduction of the wedge error, especially for detecting measurement values of the measurement means and for corresponding triggering of the driving means. The active control system, based on the measurement values of the measurement means, i.e., the gaps between the sensors and the individual surfaces that are relevant according to the invention (surfaces/support surfaces), provides for automatic readjustment of the corresponding driving means, so that parallel alignment of the first surface to the second surface is ensured at any instant.

According to one embodiment of the invention, the method is characterized by the following steps, especially in the sequence cited below:
fixing the first substrate with its retaining surface on the first retaining system and fixing the second substrate with its retaining surface on the second retaining system;
aligning the first substrate to the second substrate transversely to the direction of translation;
applying an embossing structure to the first surface of the first substrate and applying a carrier material to the second surface of the second substrate;
causing the first substrate to approach the second substrate by translational movement of the first retaining system in the direction of the second retaining system;
measuring the gaps between the first and second substrates and each sensor of the second retaining system during the approach of the first substrate to the second substrate and as soon as the first substrate is in the sensor detection region; and
evaluating the measured values and computing the angular position of the first substrate relative to the second substrate by the control system and controlling the driving means for reducing the wedge error between the first substrate and the second substrate by the driving means being triggered accordingly and the first substrate or the first retaining system being rotated accordingly relative to the substrate or the second retaining system.

Other advantages, features and details of the invention will become apparent from the following description of the figure of one preferred embodiment of the invention.

DETAILED DESCRIPTION OF PREFERRED EMBODIMENT

Figure 1:
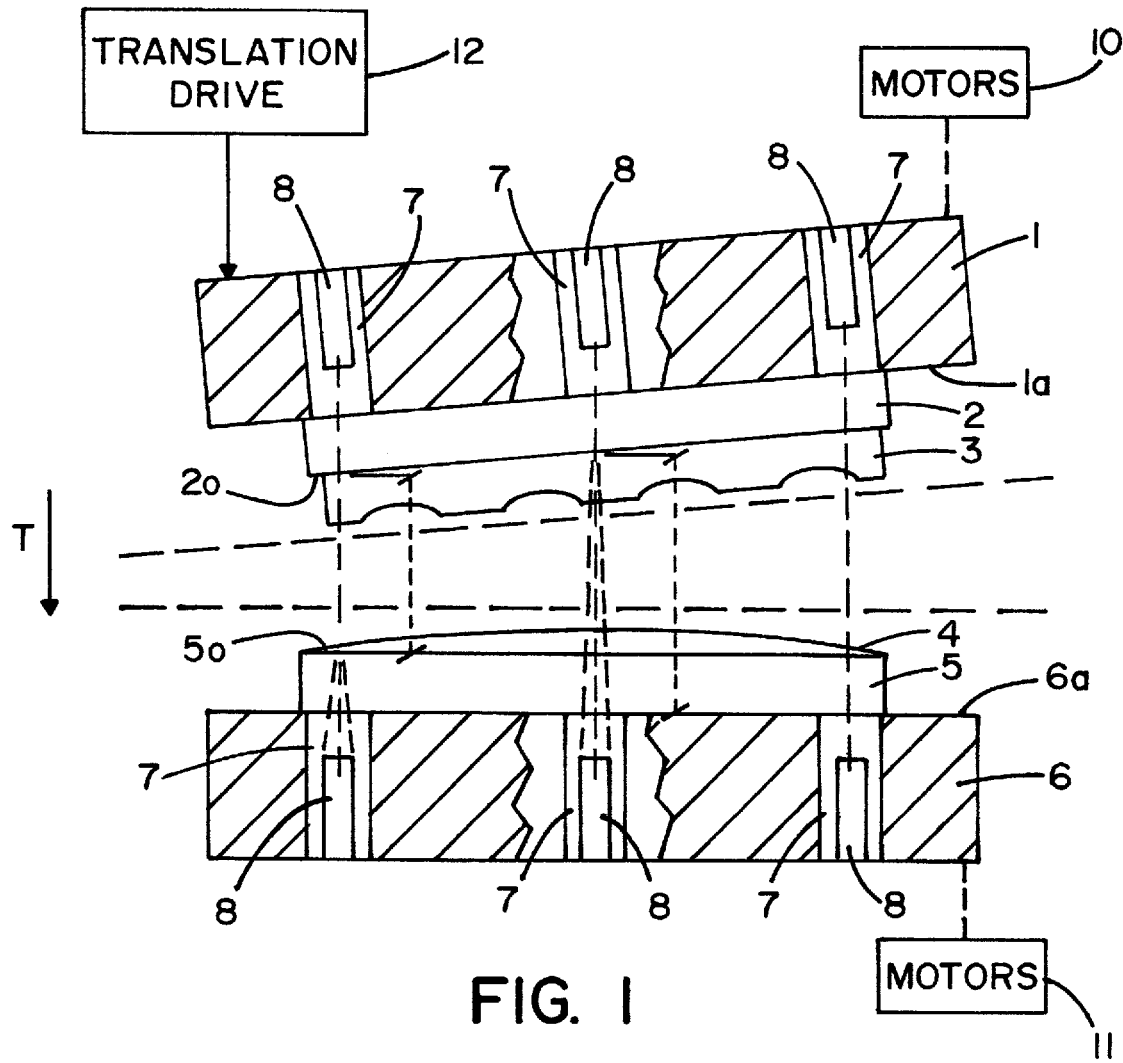
FIG. 1 shows a cross-sectional view of the device according to the invention for reducing a wedge error.

FIG. 1 shows a first retaining system of a device for opposite alignment of a first surface 2o of a first substrate 2 with a second surface 5o of a second substrate 5. A gap is defined between the first surface 2o and the second surface 5o. The second substrate 5 is fixed on a second retaining surface 6o of a second retaining system 6. The fixing of the first substrate 2 on the first retaining system 1 and the fixing of the second substrate 5 on the second retaining system 6 takes place, for example, by applying a negative pressure to one retaining surface 1a of the first retaining system 1 or retaining surface 6a of the second retaining system 6.

An embossing structure 3 is placed on the surface 2o and is used to emboss an embossing material 4 that has been applied to the surface 5o. The embossing material 4 is, for example, a polymer that during embossing assumes the contour of the embossing structure 3, namely in one end, i.e., final, position in which the embossing structure 3 dips into the embossing material 4 in order to produce a plurality of exactly dimensioned products, in the embodiment shown, microlenses, according to the contour of the embossing structure 3. A microlens field is embossed out of the embossing material and cured by the illustrated arrangement so that several microlenses can be produced later from the microlens field.

For embossing purposes, the first substrate 2 is first aligned to be parallel and flush opposite the second substrate 5. A wedge error is shown exaggerated in FIG. 1, and is represented by the broken lines that represent the angular position of the first substrate 2 and of the second substrate 5. The wedge error can result from a slanted position of the first retaining system 1 or of the second retaining system 6 relative to one another and/or opposite one direction of translation T. The wedge error can also result from non-uniform thickness of the first substrate 2 and/or of the second substrate 5 or a combination of the aforementioned causes.

The first retaining system 1 can be moved by a translation drive 12 (see FIG. 1), also called approach means, in the direction of translation T toward the second retaining system 6 for causing the first surface 2o to approach the second surface 5o. The translation drive 12 can be, for example, a robotic arm (not shown) that grips the first retaining system 1. The second retaining system 6 can be made fixed as a chuck in the device. Reversal of the motion of the two retaining systems is conceivable according to the invention.

Figure 2:
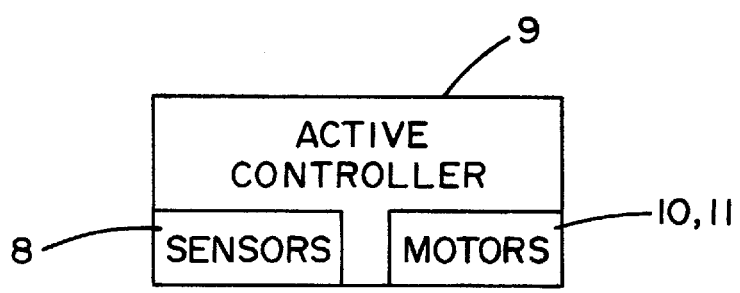
FIG. 2 shows an active controller.

During the approach of the first substrate 2 or of the embossing structure 3 toward the second substrate 5 or to the embossing material 4, the means for reducing the wedge error are, among others, several sensors 8 distributed in sensor chambers 7 of the second retaining system 6. The sensors 8 are designed as spectroscopic sensors such that each sensor 8 emits a light beam. By means of reflections and the spectroscopy of the reflected light, the gaps of the first surface 2o and the second surface 5o, that are located in the light beam to the sensor 8, can be measured. By finding the difference of the gaps—in the detection region of the respective sensor 8—at any instant of the approach of the first substrate 2 in the direction of the second substrate 5, the gap can be measured at different locations so that by corresponding control of the driving means, a corresponding rotation of the first retaining system 1 and thus of the first substrate 2 or a tilting of the first retaining system 1 is produced. FIG. 2 shows an active controller 9.

The sensors 8 work preferably with white light spectroscopy. Accordingly the second substrate 5, at least in the region of the sensor chambers 7, is transparent to light radiation and/or UV radiation. Inasmuch as the first substrate 2 is also transparent to light radiation and/or UV radiation, the gap from the sensor 8 to one support surface 2a of the first substrate on the retaining side 1a can also be measured by the sensors. Likewise, the gap from one support surface 5a of the second substrate 5 on the retaining side 6a can be measured so that the thicknesses of the substrates 2, 5 can be measured in the regions in which the beam paths of the sensors 8 travel.

Thus, both an error in the movement of the first retaining system 1 in the direction of translation T and also a faulty initial alignment and errors of thicknesses of the first substrate 2 or of the second substrate 5 or unevenness of the retaining surfaces 1a, 6a can be compensated while the first surface 2o approaches the second surface 5o.

To further optimize the spectroscopic measurement and to increase the accuracy of measurement, in one advantageous embodiment of the invention, the embossing structure 3 and the embossing material 4 are located outside the beam path of the sensors 8. Thus, mis-evaluations of the spectroscopy are avoided, and the accuracy of the determination of the gaps by the spectroscopy of the sensors is increased.

The configuration according to the invention thus solves the problem of non-uniform embossing of a microlens field as a result of wedge errors between the embossing surfaces or surfaces of the first substrate 2 and of the second substrate 5 by using an optical path system. The optical path system is comprised of several transmitter-receiver modules, i.e., the sensors 8, with which the gap of the first substrate 2 designed as an embossing die to the surface 5o of the second substrate 5 designed as a support wafer is actively measured. At the same time, during the approach of the embossing structure 3, the first retaining system 1 is readjusted by tilting or rotating such that the surface 2o is aligned parallel to the surface 5o, in the ideal case without wedge error.

The advantages of the invention lie in a higher yield of microlenses within the microlens field since a consistent, uniform lens quality can be ensured along the entire support wafer. The higher yield of lenses with negligible errors in the optical axis of the lenses clearly provides economic and technical advantages, especially in the coupling of several microlenses on top of one another. In addition to the economic advantages of the decreasing article price, the higher yield, moreover, delivers the technical advantage of a higher image quality.

The invention claimed is:

1. A device for aligning a first surface of a first substrate with a second surface of a second substrate as the first and the second surfaces move toward each other across a gap wherein embossing structures are formed on the first surface and the second surface, said device comprising:
   a first retaining system for retaining the first substrate on a first retaining surface;
   a second retaining system for retaining the second substrate on a second retaining surface;
      a translation drive for moving the first surface toward the second surface in one direction of translation (T) toward an end position; and
      an active controller that reduces a wedge error between the first and second surfaces, the active controller continuously determining the wedge error as the first surface and the second surface move toward each other.

2. A device according to claim 1, wherein said active controller is operable continuously and uninterruptedly as said first and second surfaces approach the end position.

3. A device according to claim 1, wherein the translation drive is operable to cause a translational movement of the first and second retaining systems in the direction of translation (T) transversely to the retaining surfaces.

4. A device according to claim 1, wherein the active controller comprises motors for changing an angular position of the first surface of the first substrate relative to the second surface of the second substrate, the motors being located on at least one of the first retaining system and the second retaining system.

5. A device according to claim 1, wherein the active controller comprises spectroscopically working measurement means for measuring an angular position of the first substrate relative to the second substrate as the first surface and the second surface move toward each other.

6. A device according to claim 5, wherein the measurement means include sensors disposed in at least one of the first retaining system and the second retaining system, each sensor configured to measure a distance between the first surface and the second surface in the direction of translation (T) at a different location.

7. A device according to claim 6, wherein at least one of said sensors is configured to measure a gap between a first support surface of the first substrate facing away from the first surface and a second support surface of the second substrate facing away from the second surface.

8. A device for aligning a first surface of a first substrate with a second surface of a second substrate as the first and the second surfaces move toward each other across a gap, said device comprising:
   a first retaining system for retaining the first substrate on a first retaining surface;
   a second retaining system for retaining the second substrate on a second retaining surface;
   a translation drive for moving the first surface toward the second surface in one direction of translation (T) toward an end position; and
   an active controller that reduces a wedge error between the first and second surfaces, the active controller continuously determining the wedge error as the first surface and the second surface move toward each other;
   wherein the active controller comprises spectroscopically working measurement means for measuring an angular position in the first substrate relative to the second substrate as the first surface and the second surface move toward each other; and
   wherein the measurement means include sensors disposed in at least one of the first retaining system and the second retaining system, each sensor configured to measure a distance between the first surface and the second surface in the direction of translation (T) at a different location.

9. A device according to claim 8, wherein the second substrate is transparent to light.

* * * * *